(12) United States Patent
Lee et al.

(10) Patent No.: US 6,372,537 B1
(45) Date of Patent: Apr. 16, 2002

(54) PINNED PHOTODIODE STRUCTURE IN A 3T ACTIVE PIXEL SENSOR

(75) Inventors: Chi-Hsiang Lee, Hua-Lien; An-Ming Chiang, Hsin-Chu; Wei-Kun Yeh, Hsin-chu; Hua-Yu Yang, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/527,182

(22) Filed: Mar. 17, 2000

(51) Int. Cl.$^7$ ............................................. H01L 21/00
(52) U.S. Cl. ........................ 438/48; 438/57; 438/200; 438/225
(58) Field of Search .............................. 435/48, 57, 98, 435/91, 92, 514, 527, 225, 227, 200

(56) References Cited

U.S. PATENT DOCUMENTS

| | | | |
|---|---|---|---|
| 4,499,654 A | * 2/1985 | Nishizawa et al. | |
| 5,051,797 A | 9/1991 | Erhardt | 357/24 |
| 5,070,380 A | 12/1991 | Erhardt et al. | 357/24 |
| 5,625,210 A | 4/1997 | Lee et al. | 257/292 |
| 5,841,159 A | 11/1998 | Lee et al. | 257/291 |
| 5,880,495 A | 3/1999 | Chen | 257/233 |
| 6,080,600 A | * 1/2000 | Sugiyama et al. | 438/57 |
| 6,051,447 A | * 4/2000 | Lee et al. | 438/48 |
| 6,090,639 A | * 7/2000 | Pan | 438/59 |
| 6,150,189 A | * 11/2000 | Pan | 438/59 |
| 6,265,241 B1 | * 7/2001 | Pan | 438/57 |
| ,019,850 A1 | * 9/2001 | Connoly et al. | 438/57 |

* cited by examiner

Primary Examiner—Savitri Mulpuri
(74) Attorney, Agent, or Firm—George O. Saile; Stephen B. Ackerman

(57) ABSTRACT

An active pixel sensor cell, and the process for forming the active pixel sensor cell, featuring a pinned photodiode structure, and a readout region, located in a region of the pinned photodiode structure, has been developed. The process features the formation of a N+ readout region, performed simultaneously with the formation of the N+ source/drain region of the reset transistor, however with the N+ readout region placed in an area to be used for the pinned photodiode structure. The pinned photodiode structure is next formed via formation of a lightly doped N type well region, used as the lower segment of the pinned photodiode structure, followed by the formation of P+ region, used as the top segment of the pinned photodiode structure, with the N+ readout region, surrounded by the P+ region. The placement of the N+ readout region, in a region of the pinned photodiode structure, eliminates the need for a transfer transistor, for the active pixel sensor cell, and results in a higher signal to noise ratio, as well as lower dark current generation, than counterparts fabricated without the use of the process, and structure, of this invention.

14 Claims, 4 Drawing Sheets

Table 1 — Characteristics of Active Pixel Sensors

| Type | S/N | Dark Current (mV/sec) |
|---|---|---|
| $N^+$/Pwell | 18.0 | 126.4 |
| N photosensor/PW | 24.3 | 93.4 |
| $P^+$/N photosensor/PW | 51.4 | 39.9 |

PINNED PHOTODIODE STRUCTURE IN A 3T ACTIVE PIXEL SENSOR

BACKGROUND THE INVENTION (1) Field of the Invention

The present invention relates to methods used to fabricate semiconductor devices, and more specifically to a process used to fabricate image sensing devices.

(2) Description of Prior Art

Active pixel sensor cells are usually comprised of active image sensing elements, such as photodiodes, in addition to active transistor structures, such as a reset transistor, as well as transfer transistor structures. The active pixel sensor cell is basically used to collect light energy, and then converted to an electrical signal, enabling read out to occur. Enhancements such as the use of pinned photodiodes, as the image sensing elements of the active pixel sensor cells, have allowed unwanted dark current phenomena to be reduced, resulting in increased signal to noise, (S/N) ratios to be realized, when compared to counterpart, non-pinned photodiode structures. The active pixel sensor cell is fabricated simultaneously with other complimentary metal oxide semiconductor, (CMOS), devices, used in peripheral CMOS circuits, sharing many process steps and sequences.

This invention will describe a active pixel sensor cell, formed using a pinned photodiode element, and featuring a readout region formed within the photodiode region. This concept eliminates the need for the transfer gate transistor structure, improving cell density. The P+ element of the pinned photodiode structure, can be formed simultaneously with P+ source/drain regions, used in the logic regions of CMOS, control circuits, or CMOS processing circuits, of the active pixel sensor cell. Prior art, such as Lee et al, in U.S. Pat. No. 5,625,210, as well as Chen, in U.S. Pat. No. 5,880,495, describe active pixel sensor cells, however without the concept of placing the readout region, in the photodiode area, eliminating the use of the transfer gate transistor.

SUMMARY OF THE INVENTION

It is an object of this invention to fabricate an active pixel sensor cell using a pinned photodiode element.

It is another object of this invention to form the readout region, for an active device sensor, in the pinned photodiode region.

It is still another object of this invention to eliminate the transfer gate transistor structure, from the active pixel sensor cell, made possible by the placement of an N+ readout region, within the photodiode region.

In accordance with the present invention the fabrication of, and the structure of, an active pixel sensor cell, featuring a pinned photodiode element, and featuring the formation of, and the placement of, a readout region in the photodiode region, is described. A gate structure, of a reset transistor, comprised of a polysilicon gate structure on an underlying gate insulator layer, is formed on a first region of a P type, semiconductor substrate. After formation of insulator spacers, on the sides of the gate structure of the reset transistor, heavily doped, N+ source/drain regions, are formed adjacent to the gate structure, in areas of the first region of the P type semiconductor region, not covered by the gate structure. In addition a heavily doped, N+ region, is also formed in a first portion, of the second region of the P type semiconductor substrate, to be used as a readout region for an active pixel sensor. A deep N type well is next formed in the entire second region of the P type semiconductor substrate, with the shallower N+ readout region, occupying a first portion of the deep N type well region, which in turn is located adjacent to, and butted to, the heavily doped, N + source/drain region, of the reset transistor. Heavily doped P+ regions are next formed in second portions of the N type well region, resulting in the pinned photodiode, comprised of a shallow P+ region, in the N type well region, with the pinned photodiode residing in the P well, or in the P type semiconductor substrate. The N + readout region, in the N type well region, is surrounded by the P+ region. After formation of a contact hole opening, in an insulator layer, exposing a portion of the top surface of the N+ readout region, a metal structure is formed, in the contact hole opening, for communication with the N + readout region.

An additional iteration of this invention is to form the deep N type well, in the second region of the P type semiconductor substrate, prior to formation of the gate structure located in the first region of the P type semiconductor substrate.

BRIEF DESCRIPTION OF THE DRAWINGS

The object and other advantages of this invention are best described in the preferred embodiments with reference to the attached drawings that include:

FIG. 6, which in table form, compares the enhanced characteristics of the active pixel sensor described in this invention, in terms of increase signal to noise, (S/N), and decreased dark current, to active pixel sensors fabricated without the pinned photodiode, and without the placement of the N+ readout region, in the photodiode region.

DESCRIPTION OF THE PREFERRED EMBODIMENTS

Figure 1A:
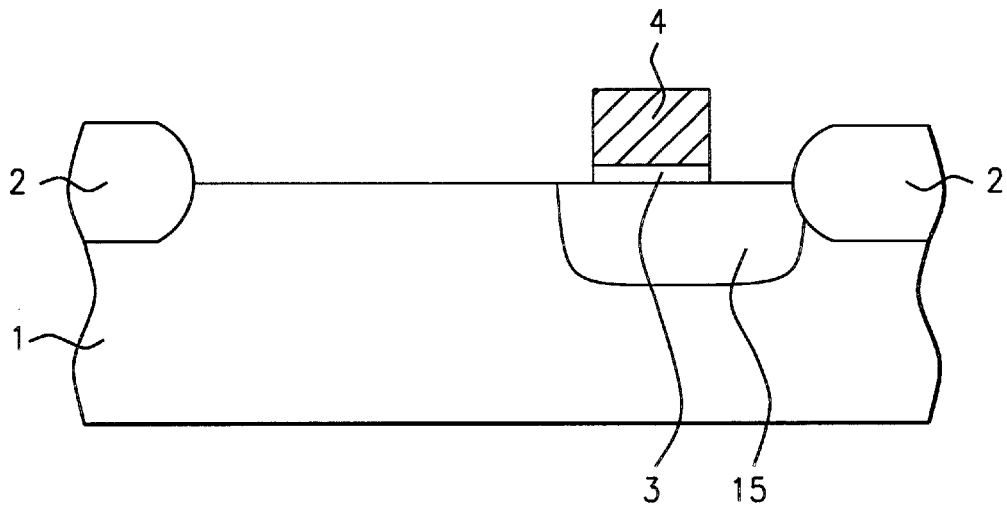
FIGS. 1A, 1B, 2–5, which schematically, in cross-sectional style, describe key stages of fabrication used to form an active pixel sensor cell, featuring the use of an N+ readout region, located in the photodiode region.
Figure 1B:
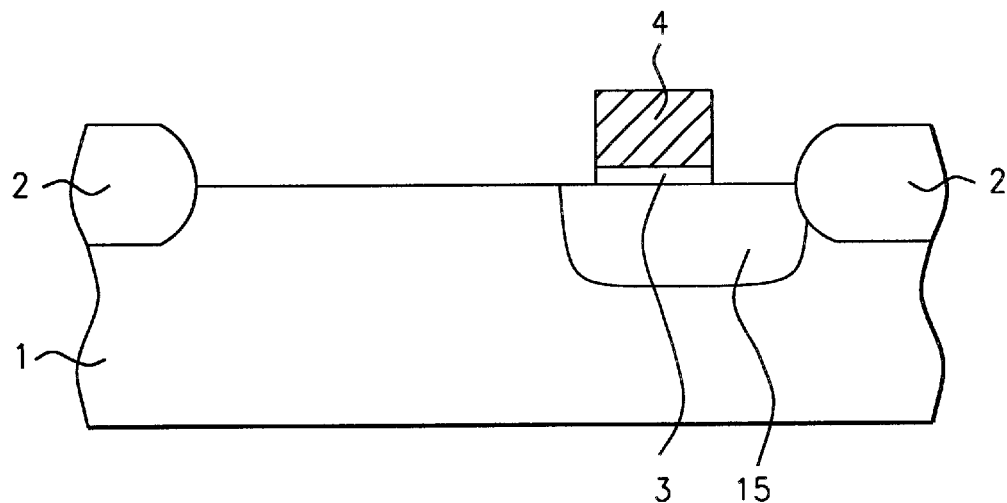

The method of fabricating an active pixel sensor cell, featuring a pinned photodiode element, and featuring the placement of a readout region, in the photodiode region, will now be described in detail. A P type, semiconductor substrate 1, comprised of single crystalline silicon, with a <100> crystallographic orientation, is used and schematically shown in FIG. 1A. If desired a P type epitaxial layer can be grown on P type semiconductor substrate 1. Field oxide, (FOX), regions 2, used as isolation regions, are next formed via a thermal oxidation procedures, performed on regions of semiconductor substrate 1, not covered by an oxidation resistant mask, such as silicon nitride. After the formation of FOX regions 2, at a thickness between about 4000 to 6000 Angstroms, obtained via thermal oxidation procedures, in an oxygen—steam ambient, the oxidation resistant pattern is removed. FIG. 1B, shows the formation of a P well region 15, placed in a region of semiconductor substrate 1, to be used for the device region, (reset transistor). P well region 15, is formed via implantation of boron, or $BF_2$ ions, at an energy between about 60 to 120 KeV, and at a dose between about 1E12 to 1E13 atoms/$cm^2$. The area of semiconductor substrate 1, to subsequently be used for the photodiode element region is protected from the P well, ion implantation procedure, by a masking photoresist shape which is then removed plasma oxygen ashing and careful wet cleans. For the remainder of the description of this invention, the option of using P well region 15, will not be shown in the drawings, however P type semiconductor substrate 1, will be shown, and used to accommodate the subsequent pinned photodiode element. If desired P well region 15, can also be formed in the photodiode element region of P type semiconductor substrate 1.

A gate insulator layer 3, comprised of silicon dioxide is thermally grown on the surface of P type, semiconductor substrate 1, at a thickness between about 100 to 200 Angstroms. A polysilicon layer is next deposited, via low pressure chemical vapor deposition, (LPCVD), procedures, to a thickness between about 1500 to 4000 Angstroms. The polysilicon layer can be doped in situ, during deposition, via the addition of arsine, or phosphine, to a silane ambient, or the polysilicon layer can be deposited intrinsically then doped via implantation of arsenic, or phosphorous ions. Conventional photolithographic and anisotropic, reactive ion etching, (RIE), procedures, using $Cl_2$ as an etchant, are used to create polysilicon gate structure 4. This is schematically shown in FIG. 1A. The photoresist shape, used to define polysilicon gate structure 4, is removed via plasma oxygen ashing and careful wet cleans, with the portion of gate insulator layer 3, not covered by polysilicon gate structure 4, removed during a buffered hydrofluoric acid dip, used as part of the careful wet clean procedure. Polysilicon gate structure 4, to be used for a subsequent reset transistor structure, for the active pixel sensor cell, was formed simultaneously with the gate structures used for CMOS devices in peripheral regions.

Figure 2:
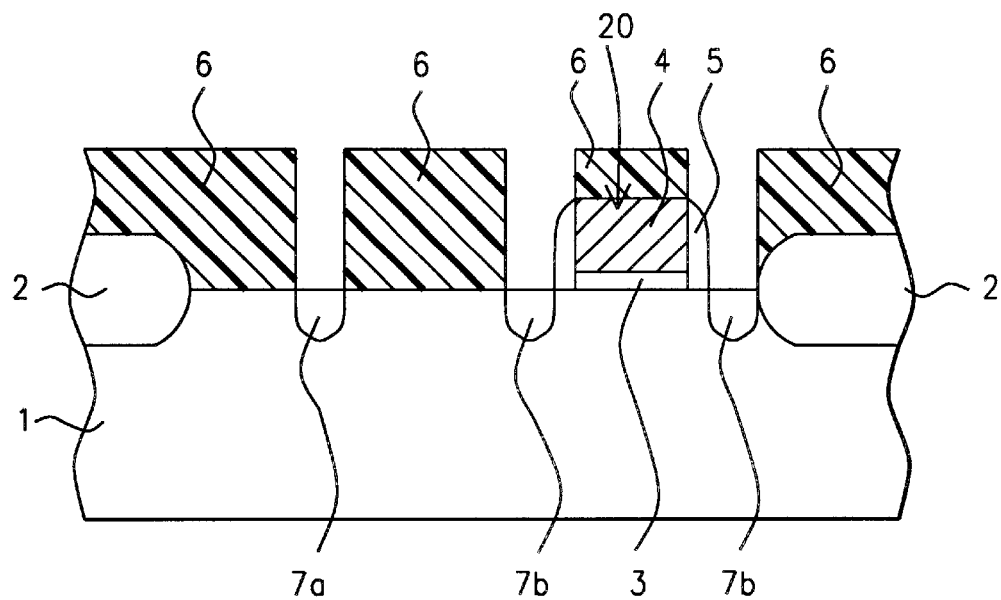
Figure 3:
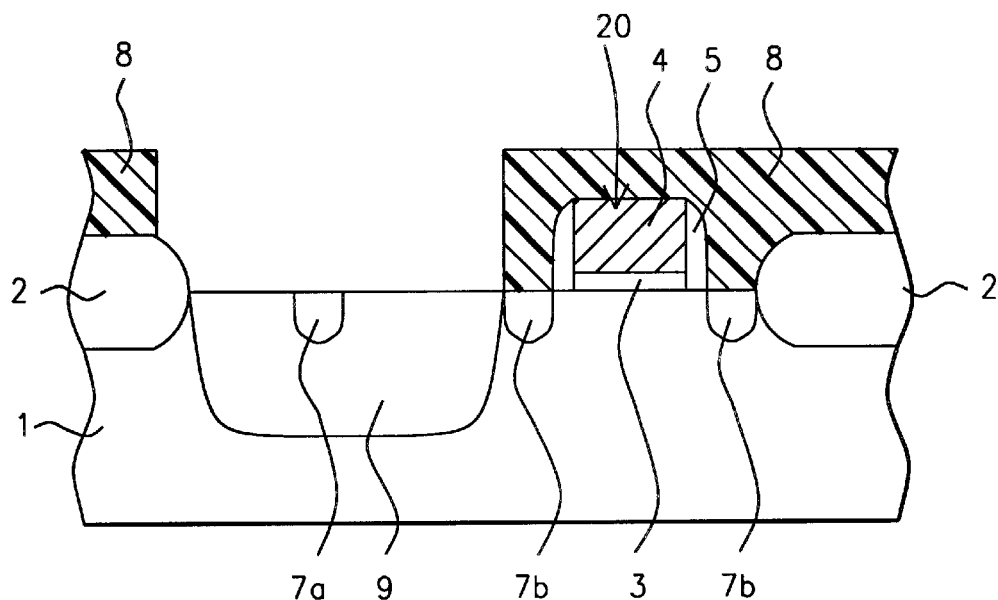

Insulator spacers 5, shown schematically in FIG. 2, are next formed on the sides of polysilicon gate structure 4, via deposition of a silicon oxide, or a silicon nitride layer, via LPCVD or via plasma enhanced chemical vapor deposition, (PECVD), procedures, at a thickness between about 1500 to 3000 Angstroms, followed by an anisotropic RIE procedure, using $CHF_3$ as an etchant. The formation of heavily doped N+ regions, used for source/drain regions for a reset transistor, and used for the readout region for the active pixel sensor, is next addressed, and schematically shown in FIG. 2. Photoresist shape 6, is formed, allowing ion implantation of arsenic or phosphorous ions, at an energy between about 30 to 80 KeV, at a dose between about 1E15 to 5E15 atoms/$cm^2$, to form heavily doped, N+ source/drain regions 7b, for reset transistor 20. This procedure also creates N+ readout region 7a, in a region of P type semiconductor substrate 1, which will subsequently accommodate a pinned photodiode region, for active pixel sensor cell. Photoresist shape 6, is then removed via plasma oxygen ashing and careful wet cleans, followed by the formation of photoresist shape 8, which allows an N type ion implantation procedure, to create N type well region, or tub 9, to be used as an element for a subsequently formed pinned photodiode structure. N type well region 9, is formed via implantation of arsenic or phosphorous ions, at an energy between about 60 to 180 KeV, at a dose between about 1E12 to 1E14 atoms/$cm^2$. This is schematically shown in FIG. 3. Photoresist shape 8, is removed again, using plasma oxygen ashing and careful wet clean procedures. The N+ regions, as well as the N well regions, formed for the active pixel sensor, can be formed simultaneously with the heavily doped, N+ source/drain regions, and with the N type, lightly doped source/drain region, formed for CMOS devices in adjacent circuitry.

Another iteration of this invention is the formation of N well region 9, prior to the formation of the gate structure, of the reset transistor, and prior to the formation of heavily doped $N^+$ regions 7a, and 7b.

Figure 4:
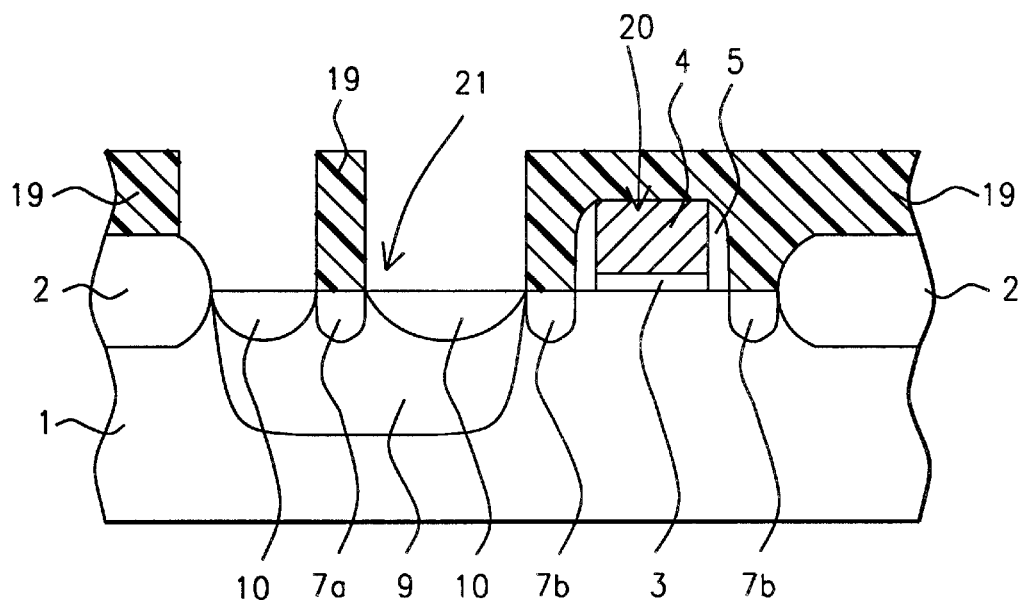

Photoresist shape 19, is next formed, to allow the P+ element of pinned photodiode 21, to be created. Photoresist shape, shown schematically in FIG. 4, blocks out reset transistor 20, and the N+ readout region 7a, from an ion implantation procedure, performed using boron, or $BF_2$ ions, at an energy between about 30 to 70 KeV, at a dose between about 1E15 to 5E15 atoms/$cm^2$. This ion implantation procedure creates P+ region 10, surrounding N+ readout region 7a, in N type well region 9. This results in pinned photodiode structure 21, comprised of P+ region 10/N well region 9, featuring N+ readout region 7a, in N type well region 9, surrounded by P+ region 10. This is schematically shown in FIG. 4. Again the P+ elements of the pinned photodiode structure, can be formed simultaneously with the heavily doped, P+ source/drain regions, formed for P channel CMOS devices, used in regions supporting the active pixel sensor cell. This completes the formation of the basic elements of the active pixel sensor cell, comprised of reset transistor structure 20, which allows the cell to be reset from previous cycles; pinned photodiode element 21, which allows light to be collected and converted to a electrical signal; and readout region 7a, which allows the electrical signal from the pinned photodiode to be read. In this unique configuration, shown schematically in FIG. 4, N+ readout region 7a, is placed in the region used for pinned photodiode element 21, conserving space, and eliminating the need for an additional transistor, placed between the reset transistor and pinned photodiode elements, used to accommodated the readout region.

Figure 5:
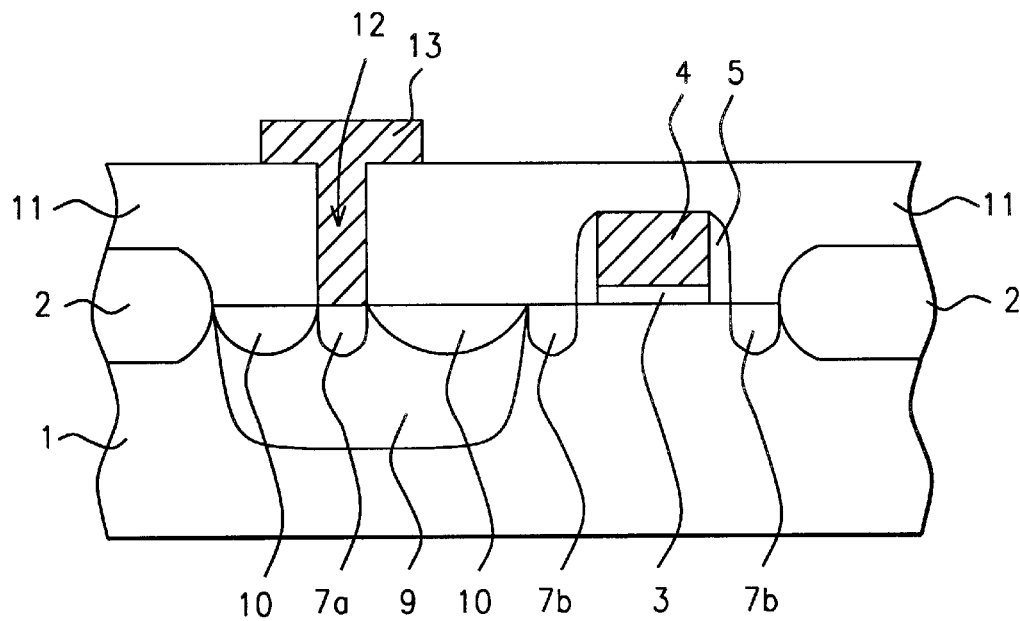

After removal of photoresist shape 19, via plasma oxygen ashing and careful wet cleans, contact structures are formed to specific elements of the active pixel sensor cell. FIG. 5, schematically shows the creation of metal contact structure 13, to N+ readout region 7a. This is accomplished via deposition of an insulator layer 11, such as silicon oxide, or borophosphosilicate glass, via LPCVD or via plasma enhanced chemical vapor deposition, (PECVD), procedures, to a thickness between about 4000 to 9000 Angstroms. Conventional photolithographic and anisotropic RE procedures, using $CHF_3$ as an etchant, are then used to open contact hole 12, in insulator layer 11, exposing a portion of the top surface of N+ readout region 7a. After removal of the photoresist shape, used for definition of contact hole 12, via plasma oxygen ashing and careful wet cleans, a metal layer, such as aluminum, aluminum—copper, or tungsten, is deposited via plasma vapor deposition, or via chemical vapor deposition procedures, to a thickness between about 3000 to 6000 Angstroms, completely filling contact hole 12. Conventional photolithographic and anisotropic RIE procedures, using $Cl_2$ as an etchant, are used to form metal contact structure 13, shown schematically in FIG. 5, overlying, and contacting, N+ readout region 7a. The photoresist shape, used for definition of metal structure 13, is again removed using plasma oxygen ashing and careful wet cleans. Although not shown in the drawings, other metal contact structures, such as a structure contacting the polysilicon gate structure, of the reset transistor, are also formed during the above procedures.

The improved electrical characteristics of the active pixel sensor cell, obtained using the process, and the structure described in this invention, such as the use of a pinned photodiode structure, featuring an N+ readout region located in the pinned photodiode region, surrounded by the P+ element of the pinned photodiode structure, is shown in FIG. 6. Table 1, in FIG. 6, compares the signal to noise, (S/N), ratio, as well as the dark current, for active pixel sensors with photodiode structures created from three types of diode structures: an N+/P well diode, an N well region/P well diode; and the pinned photodiode of this invention. The pinned photodiode of this invention again is comprised of P+/N well region/P well, (or P+/N well region/P type semiconductor substrate), also featuring the placement of the N+ read out region, in the pinned photodiode region. The S/N ratio of the pinned photodiode, described in this invention is about 51, compared to counterparts with S/N ratios only between about 18 to 24. In addition the pinned photodiode of this invention results in unwanted dark currents of about 40, compared again to counterparts generating between about 93 to 126 mV/sec.

While this invention has been particularly shown and described with reference to the preferred embodiments thereof, it will be understood by those skilled in the art that various changes in form and details may be made without departing from the spirit and scope of this invention.

What is claimed is:

1. A method of forming an active pixel sensor, on a semiconductor substrate, comprising the steps of:

forming a gate structure, for a reset transistor, on an underlying gate insulator layer, located on a first portion of a semiconductor substrate, of a first conductivity type;

performing a first ion implantation procedure, of a second conductivity type simutaneously to form a source/drain region for said reset transistor, in an area of said first portion of said semiconductor substrate, not covered by said gate structure, and forming a readout region, in a section of a second portion of said semiconductor substrate;

performing a second ion implantation procedure, of said second conductivity type to form a bottom segment of a pinned photodiode structure, in said second portion of said semiconductor substrate;

performing a third ion implantation procedure, of said first conductivity type, to form a top segment of said pinned photodiode structure adjacent to the sides of the readout region, in an area of said second portion of said semiconductor substrate, not occupied by said readout region; and forming a metal contact structure, overlying and contacting, a top portion of said readout region.

2. The method of claim 1, wherein said semiconductor substrate, is a P type semiconductor substrate, or P type semiconductor substrate, with an overlying P type, epitaxial layer.

3. The method of claim 1, wherein said gate structure is a polysilicon gate structure, formed from a polysilicon layer which is obtained via LPCVD procedures, at a thickness between about 1500 to 4000 Angstroms, then defined via an anisotropic RIE procedure, using $Cl_2$ as an etchant.

4. The method of claim 1, wherein said source/drain region, of said reset transistor, is a heavily doped, N+ source/drain region, formed via said first ion implantation procedure, performed using arsenic, or phosphorous ions, at an energy between about 30 to 80 KeV, at a dose between about 1E15 to 5E15 atoms/$cm^2$.

5. The method of claim 1, wherein said readout region, is a heavily doped, N+ region, formed via said first ion implantation procedure, performed using arsenic, or phosphorous ions, at an energy between about 30 to 80 KeV, at a dose between about 1E15 to 5E15 atoms/$cm^2$.

6. The method of claim 1, wherein said bottom segment of said pinned photodiode structure, is an N type well region, formed via said second ion implantation procedure, performed at an energy between about 60 to 180 KeV, at a dose between about 1E12 to 1E14 atoms/$cm^2$.

7. The method of claim 1, wherein said top segment of said pinned photodiode structure, is a heavily doped P+ region, formed via said third ion implantation procedure, performed at an energy between about 30 to 70 KeV, at a dose between about 1E15 to 5E15 atoms/$cm^2$.

8. A method of forming an active pixel sensor cell, on a semiconductor substrate, featuring a pinned photodiode structure, and a readout region located in a portion of the pinned photodiode region, comprising the steps of:

forming a P well region, in a first region of said semiconductor substrate to be used for a pinned photodiode structure;

forming a polysilicon gate structure, on an underlying silicon dioxide gate insulator layer, on a second region of said semiconductor substrate to be used for a reset transistor;

forming insulator spacers on the sides of said polysilicon gate structure; forming an N+ source/drain region, in an area of said second region of said semiconductor substrate, not covered by said polysilicon gate structure, and not covered by said insulator spacers;

forming an N+ readout region, in a top portion of said P well region, wherein N+ source/drain region and readout region are simultaneously formed;

forming an N type well region, of said pinned photodiode structure, in an area of said P well region, not occupied by said N+ readout region;

forming a P+ region, of said pinned photodiode structure, in a top portion of said N type well region, in an area of said N well type region, adjacent to the sides of said N + readout region;

depositing an insulator layer;

forming a contact hole in said insulator layer, exposing a portion of the top surface of said N+ readout region; and forming a metal structure in said contact hole.

9. The method of claim 8, wherein said silicon dioxide gate insulator layer, of said reset transistor, is obtained via thermal oxidation procedures, at a thickness between about 100 to 200 Angstroms.

10. The method 8, wherein said polysilicon gate structure is formed from a polysilicon layer, obtained via LPCVD procedures, at a thickness between about 1500 to 4000 Angstroms, and defined via an anisotropic RIE procedure, using $Cl_2$ as an etchant.

11. The method of claim 8, wherein said insulator spacers are comprised of silicon oxide, or silicon nitride, at a thickness between about 1500 to 3000 Angstroms.

12. The method of claim 8, wherein said N+ source/drain region, and said N+ readout region, are formed via an ion implantation procedure using arsenic, or phosphorous ions, at an energy between about 30 to 80 KeV, and at a dose between about 1E15 to 5E15 atoms/$cm^2$.

13. The method of claim 8, wherein said N type well region is formed via an ion implantation procedure, an energy between about 60 to 189 KeV, at a dose between about 1E12 to 1E14 atoms/$cm^2$.

14. The method of claim 8, heavily P+ region is formed via an ion implantation procedure, at an energy between about 30 to 70 KeV, at a dose between about 1E15 to 5E15 atoms/$cm^2$.

* * * * *